(12) United States Patent
Nagaune

(10) Patent No.: US 8,957,508 B2
(45) Date of Patent: Feb. 17, 2015

(54) SEMICONDUCTOR DEVICE AND METHOD OF MANUFACTURING THE SAME

(75) Inventor: Fumio Nagaune, Matsumoto (JP)

(73) Assignee: Fuji Electric Co., Ltd., Kawasaki-shi, Kanagawa (JP)

( * ) Notice: Subject to any disclaimer, the term of this patent is extended or adjusted under 35 U.S.C. 154(b) by 0 days.

(21) Appl. No.: 14/110,841

(22) PCT Filed: May 11, 2012

(86) PCT No.: PCT/JP2012/062215
§ 371 (c)(1),
(2), (4) Date: Oct. 22, 2013

(87) PCT Pub. No.: WO2012/157584
PCT Pub. Date: Nov. 22, 2012

(65) Prior Publication Data
US 2014/0048918 A1    Feb. 20, 2014

(30) Foreign Application Priority Data

May 13, 2011    (JP) .................................. 2011-108719

(51) Int. Cl.
*H01L 23/495*    (2006.01)
*H01L 23/00*    (2006.01)
*H01L 23/433*    (2006.01)
*H01L 23/498*    (2006.01)

(52) U.S. Cl.
CPC .......... *H01L 23/49568* (2013.01); *H01L 24/34* (2013.01); *H01L 23/4334* (2013.01); *H01L 23/49844* (2013.01); *H01L 24/73* (2013.01); *H01L 24/33* (2013.01); *H01L 24/83* (2013.01); *H01L 2224/32225* (2013.01); *H01L 2224/48227* (2013.01); *H01L 2224/73265* (2013.01); *H01L 23/49811* (2013.01); *H01L 2224/48091* (2013.01); *H01L 2224/45124* (2013.01); *H01L 2224/73221* (2013.01); *H01L 2924/30107* (2013.01)
USPC .......................................... 257/675; 438/122

(58) Field of Classification Search
CPC .... H01L 23/49568; H01L 24/33; H01L 24/83
USPC ........................................ 257/675; 438/122
See application file for complete search history.

(56) References Cited

U.S. PATENT DOCUMENTS 7,569,929 B2 *    8/2009   Mori et al. .................... 257/706
2004/0102023 A1    5/2004   Morozumi et al.

FOREIGN PATENT DOCUMENTS

| JP | H09-082844 A | 3/1997 |
|---|---|---|
| JP | 2003-017627 A | 1/2003 |
| JP | 2005-072098 A | 3/2005 |
| JP | 2006-245436 A | 9/2006 |
| JP | 2010-283107 A | 12/2010 |

* cited by examiner

*Primary Examiner* — Roy Potter
(74) *Attorney, Agent, or Firm* — Manabu Kanesaka

(57) ABSTRACT

A semiconductor device has a connection structure in which a power semiconductor chip is mounted on an insulating substrate having conductor patterns bonded to front and rear surfaces thereof, and the insulating substrate is connected to a heat-dissipating base member to dissipate heat generated from the power semiconductor chip to outside. The conductor pattern on the rear surface bonded to the heat-dissipating base member has a bonding portion having a rectangular shape and a predetermined curvature radius in vicinity of corners.

7 Claims, 10 Drawing Sheets

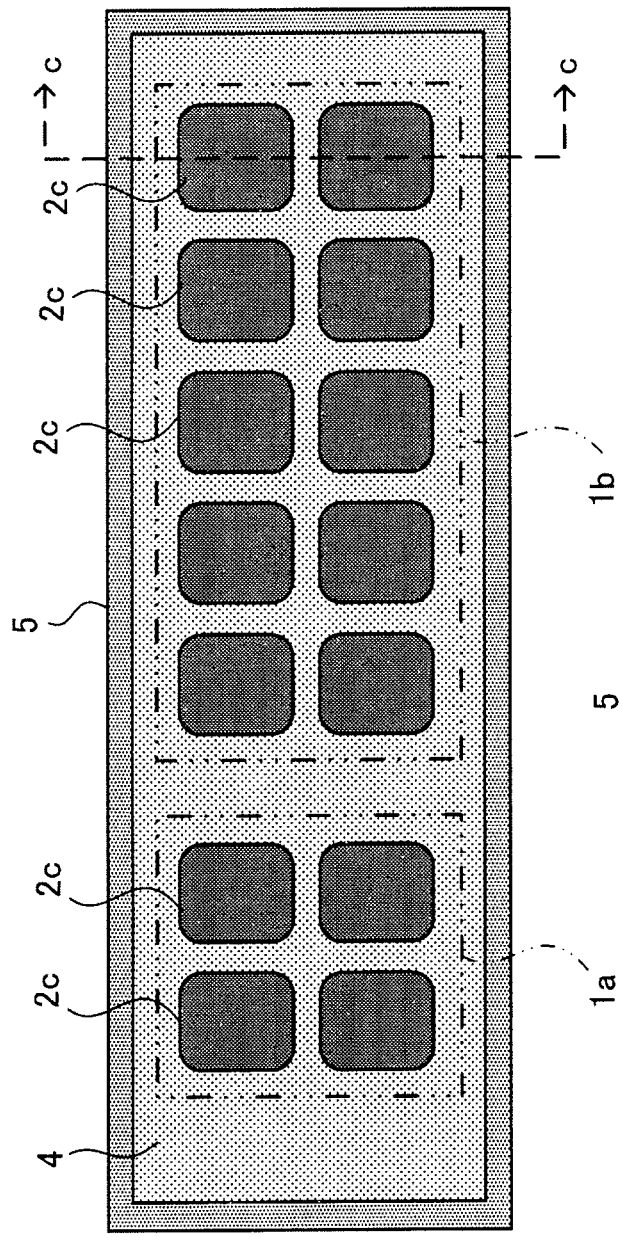
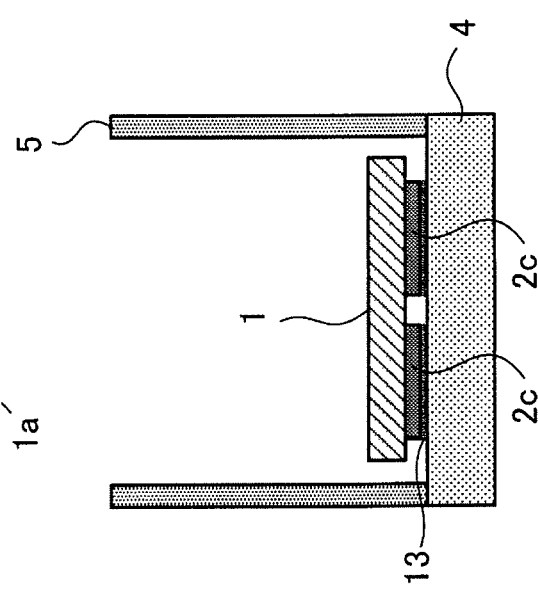
Fig. 4(A)
Fig. 4(B)

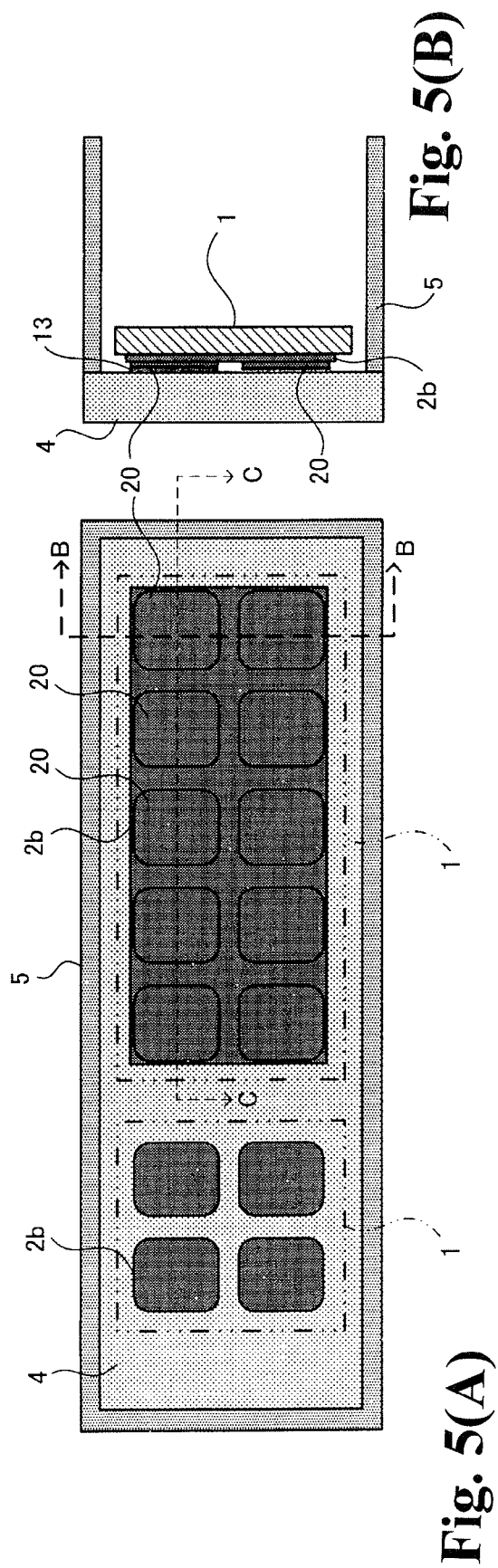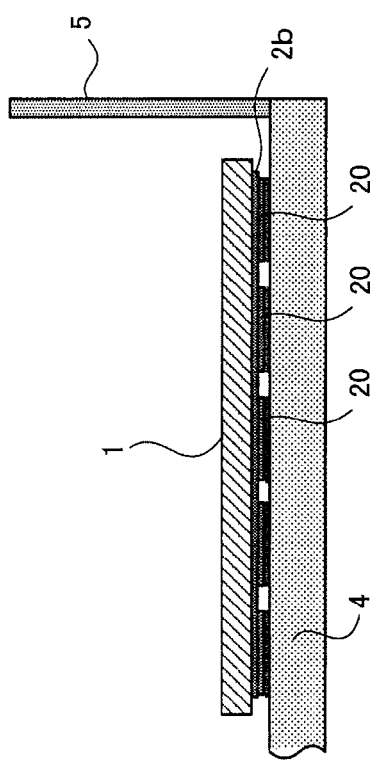
Fig. 5(A) Fig. 5(B) Fig. 5(C)

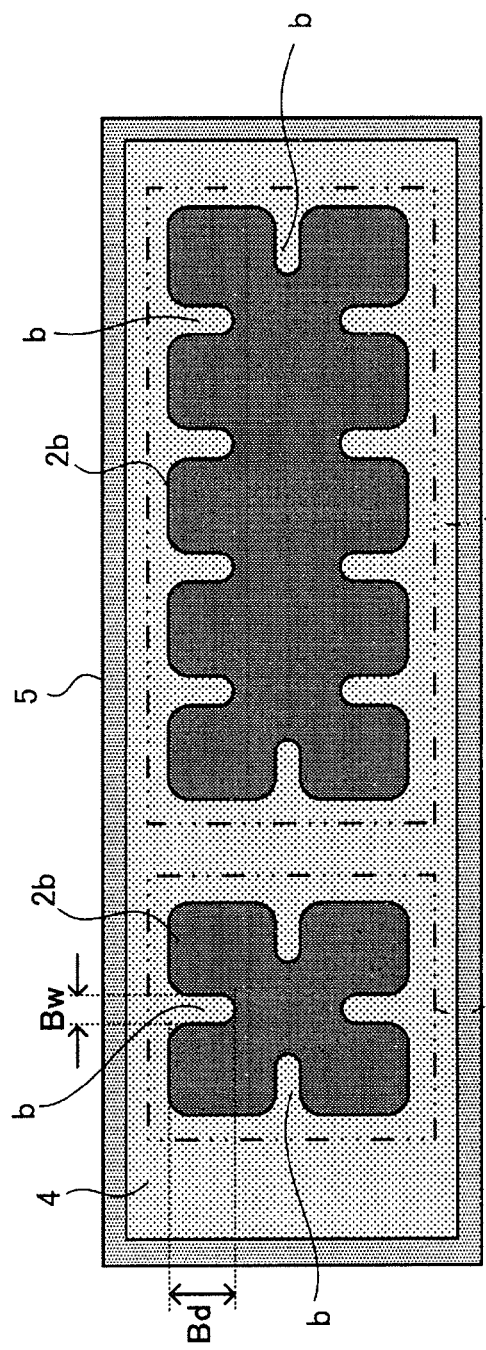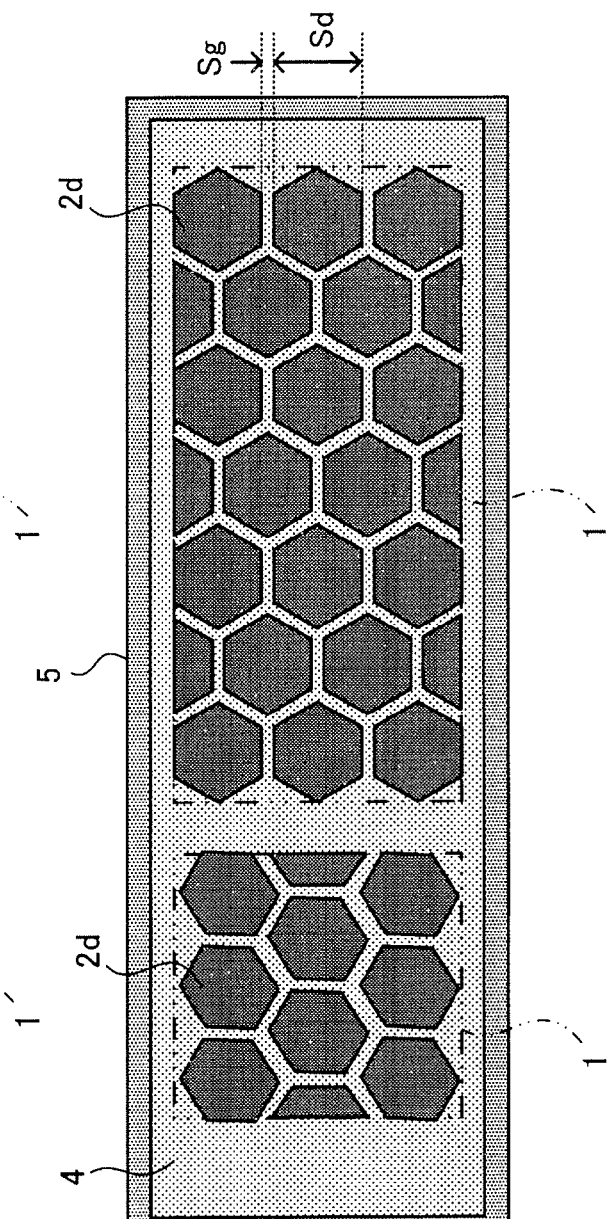
Fig. 7(A)
Fig. 7(B)

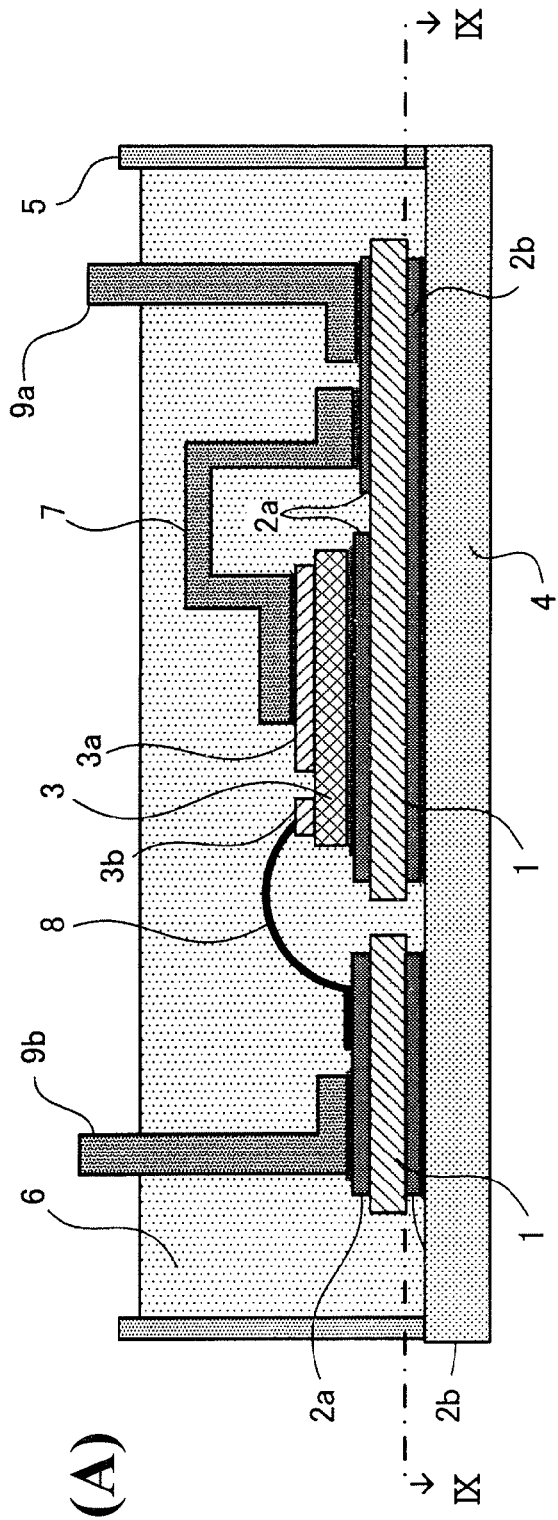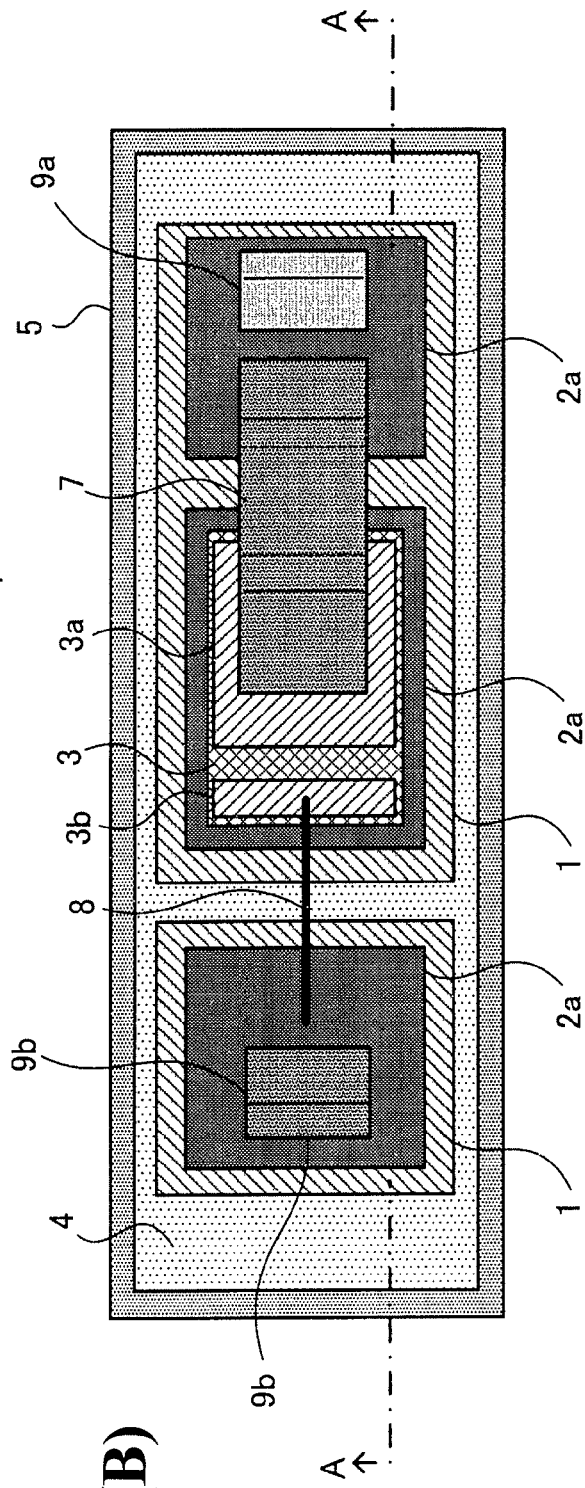

ULTRASOUND PICTURE OF PORTION
OF SOLDER IN WHICH CRACK OCCURS
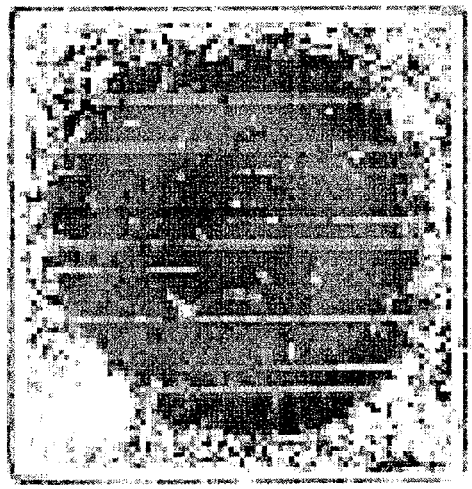
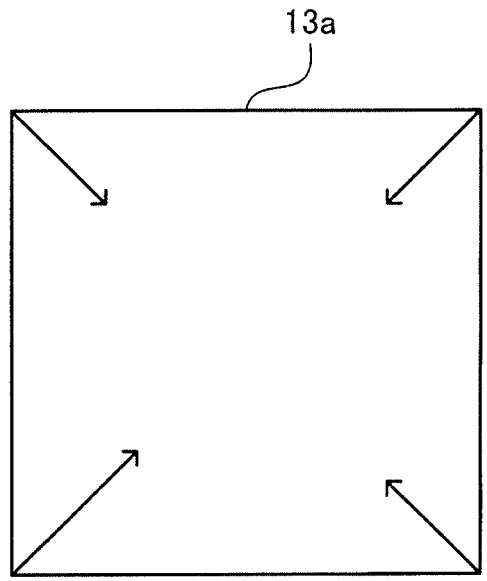
Fig. 10(A)
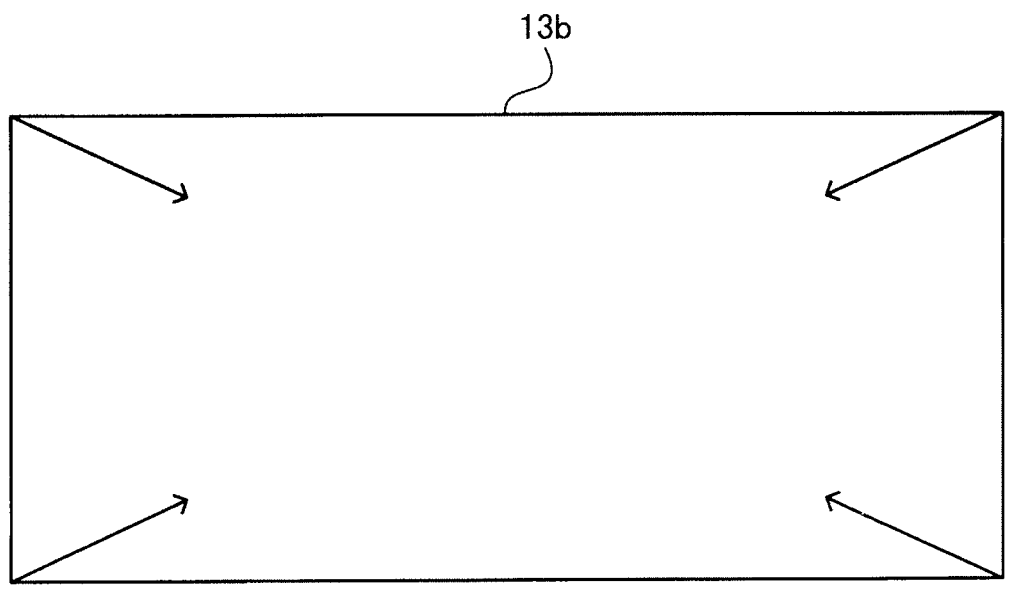
Fig. 10(B)

SEMICONDUCTOR DEVICE AND METHOD OF MANUFACTURING THE SAME

RELATED APPLICATIONS

The present application is National Phase of International Application No. PCT/JP2012/062215 filed May 11, 2012, and claims priority from Japanese Applications No. 2011-108719 led May 13, 2011.

TECHNICAL FIELD

The present invention relates to a semiconductor device that is intended for, for example, a power semiconductor module and a method of manufacturing the same, and more particularly, to a semiconductor device having a connection structure in which a power semiconductor chip is mounted on an insulating substrate and the insulating substrate is bonded to a heat-dissipating base member such that heat generated from the power semiconductor chip can be dissipated to the outside and a method of manufacturing the same.

BACKGROUND ART

In the semiconductor device which is intended for, for example, the power semiconductor module, with an increase in current capacity and the density of components and a reduction in the size of the module, the amount of current flowing through wiring lines in the package has increased and it is necessary to improve the radiation performance of the module. In addition, in many cases, a lead frame using a copper plate is used, instead of aluminum wire bonding according to the related art, in order to reduce wiring inductance.

FIGS. 8(A), 8(B) are a vertical cross-sectional view and a plan view illustrating a semiconductor device according to the related art. FIG. 8(A) is a vertical cross-sectional view taken along the line A-A of FIG. 8(B). An insulating substrate made of, for example, ceramic is a DBC (Direct Bonding Copper) substrate having conductor patterns 2a, 2b bonded to both surfaces thereof. In addition, a semiconductor chip 3 is mounted on the conductor pattern 2a which is formed as a copper circuit on the front surface of the insulating substrate 1 by soldering. The conductor pattern 2b which has the same thickness as the conductor pattern 2a and is bonded to the rear surface of the insulating substrate 1 is bonded to a heat-dissipating base member 4 to dissipate heat generated from the semiconductor chip 3 to the outside. The heat-dissipating base member 4 forms the bottom of a resin case 5 and two large and small insulating substrates 1 are bonded to the heat-dissipating base member 4. The semiconductor chip 3, an internal connection terminal 7, and an aluminum wire 8 are protected by a gel-like sealing member 6 which is filled in the resin case 5.

FIG. 8(B) is a plan view illustrating the state of the semiconductor device before the sealing member 6 is filled. Metal electrodes 3a, 3b of the semiconductor chip 3 are internally wired to predetermined portions of the conductor pattern 2a by the internal connection terminal 7 and the aluminum wire 8. In addition, a plurality of external lead terminals 9a, 9b is drawn from the conductor pattern 2a to the upper surface of the resin case 5. The internal connection terminal 7 and the external lead terminals 9a, 9b are lead frames obtained by processing copper plates.

In the semiconductor device, such as a module-type power semiconductor device, an intelligent power module, or a discrete semiconductor product, the metal electrodes 3a, 3b of the semiconductor chip 3 and the internal connection terminal 7 and also the internal connection terminal 7 and the conductor pattern 2a fixed to the insulating substrate 1 are wired inside the device, and the external lead terminals 9a, 9b are drawn to the outside of the device. In the semiconductor device, in general, the semiconductor chip 3 and the conductor pattern 2a, the conductor pattern 2b and the heat-dissipating base member 4, or the conductor pattern 2a and the internal connection terminal 7 or the external lead terminals 9a, 9b are connected to be wired by, for example, soldering, brazing, ultrasonic bonding, or laser welding. In addition, in general, components of the semiconductor device have a square shape or a rectangular shape and are formed by bonding metal materials with different thermal expansion coefficients.

FIG. 9 is a cross-sectional view illustrating the semiconductor device according to the related art taken along the line IX-IX of FIG. 8(A).

In the semiconductor device intended for, for example, a power semiconductor module, in general, the conductor pattern 2b bonded to the heat-dissipating base member 4 has a square shape or a rectangular shape, as illustrated in FIG. 9. In addition, in general, when a wiring line is formed between a semiconductor chip and a metal terminal, between metal materials, or between the metal terminal and a metal pattern fixed to an insulating substrate, each of the components which are connected to each other has a shape corresponding to the outer shape of the module and has a square shape or a rectangular shape. Therefore, when the semiconductor chip and the metal terminal, or metal materials with different thermal expansion coefficients are connected to each other by soldering or brazing, the components have different thermal expansion coefficients in, for example, the temperature cycle reliability test and stress which occurs along the bonding surface is concentrated on an angular corner. Therefore, a solder layer or a brazing filler metal layer is likely to be broken or cracked.

FIGS. 10(A), 10(B) are diagrams illustrating a crack which occurs in a solder fixing layer in the temperature cycle test. FIGS. 10(A), 10(B) illustrate cracks which occur when components are repeatedly expanded and contracted in, for example, the temperature cycle reliability test in a state in which the conductor patterns 2b formed on the rear surfaces of the two large and small insulating substrates 1 illustrated in FIGS. 8(A), 8(B) are fixed to the heat-dissipating base member 4 by soldering.

In FIGS. 10(A) and 10(B), the progression direction of the crack which occurs in each of the fixing layers 13a, 13b is represented by an arrow. In the ultrasound picture of the fixing layer 13a illustrated in FIG. 10(A) which has a square shape in a plan view, a region corresponding to a portion of the solder in which a crack occurs is represented as a large white region.

As above, in the semiconductor device in which the lower surface of the conductor pattern 2b corresponding to the metal member 12 illustrated in FIG. 10 is soldered to the heat-dissipating base member 4 corresponding to the metal member 11, a large shear strain occurs at the corners of the fixing layer 13, which causes a crack to occur from the corners. When the crack occurred at the corners of the insulating substrate 1 reaches a bonding surface to the semiconductor chip 3, a heat flux from the insulating substrate 1 to the heat-dissipating base member 4 is blocked by the crack. Therefore, the radiation performance of the semiconductor chip 3 for radiating the generated heat deteriorates. As a result, the junction temperature of an element abnormally increases, which leads to thermal fracture.

The following Patent Document 1 discloses a semiconductor device with the following connection structure. When the thickness of a solder layer is small, fatigue breakdown occurs rapidly due to thermal stress which is applied to a soldering portion due to the difference in thermal expansion between an insulating substrate and a lead frame due to a heat cycle in a usage environment. Therefore, a protrusion is formed on a soldering surface of the copper circuit pattern of the lead frame or the insulating substrate to prevent a variation in the thickness of the solder layer.

Furthermore, Patent Document 2 discloses a structure in which, in order to reduce stress applied to a bonding portion, chamfered portions are formed at four corners of a substrate or a slit is formed in a conductor pattern. In this structure, thermal stress which is applied to the bonding portion due to a thermal cycle is reduced to increase the time until a crack occurs, thereby preventing the growth of the crack.

CITATION LIST

Patent Document

Patent Document 1: Japanese Patent No. 4100685 (see paragraphs [0008] to [0014])
Patent Document 2: Japanese Patent No. 4124040 (see paragraphs [0024] to [0071])

DISCLOSURE OF THE INVENTION

Problem to be Solved by the Invention

As such, shear stress is likely to be concentrated on the corners of a metal component having a square shape or a rectangular shape, which causes a crack to occur from the corners of the fixing layer. The growth of the crack which occurs in the bonding surface reduces the radiation performance of the semiconductor device, which makes it difficult to dissipate heat generated from, particularly, a power semiconductor module to the outside. Finally, a serious problem of thermal fracture occurring in the semiconductor device arises.

The invention has been made in view of the above-mentioned problems and an object of the invention is to provide a semiconductor device which is capable of reducing the concentration of stress on the corners of a bonding portion to suppress or prevent the progression of a crack in a solder layer in, for example, a temperature cycle reliability test and a method of manufacturing the same.

Means for Solving Problem

In order to solve the above-mentioned problems, according to the invention, there is provided a semiconductor device having a connection structure in which a power semiconductor chip is mounted on an insulating substrate having conductor patterns bonded to front and rear surfaces thereof and the insulating substrate is connected to a heat-dissipating base member to dissipate heat generated from the power semiconductor chip to outside. In the semiconductor device, the conductor pattern on the rear surface bonded to the heat-dissipating base member has a bonding portion having a rectangular shape and a predetermined curvature radius in vicinity of corners. The predetermined curvature radius is in the range of 1 mm to 10 mm.

In order to solve the above-mentioned problems, according to the invention, there is provided a semiconductor device having a connection structure in which a power semiconductor chip is mounted on an insulating substrate having conductor patterns bonded to front and rear surfaces thereof and the insulating substrate is connected to a heat-dissipating base member to dissipate heat generated from the power semiconductor chip to the outside. In the semiconductor device, the conductor pattern on the rear surface bonded to the heat-dissipating base member includes a plurality of bonding portions to the corresponding heat-dissipating base member. Each of the plurality of bonding portions has a rectangular shape and has a predetermined curvature radius in the vicinity of corners. The predetermined curvature radius is in the range of 1 mm to 10 mm.

In order to solve the above-mentioned problems, according to the invention, there is provided a semiconductor device having a connection structure in which a power semiconductor chip is mounted on an insulating substrate having conductor patterns bonded to front and rear surfaces thereof and the insulating substrate is connected to a heat-dissipating base member to dissipate heat generated from the power semiconductor chip to the outside. In the semiconductor device, the conductor pattern on the rear surface bonded to the heat-dissipating base member has a bonding portion having a shape including one or more curved portions and has a predetermined curvature radius in the vicinity of the curved portions and corners. The predetermined curvature radius is in the range of 1 mm to 10 mm.

In order to solve the above-mentioned problems, according to the invention, there is provided a semiconductor device having a connection structure in which a power semiconductor chip is mounted on an insulating substrate having conductor patterns bonded to front and rear surfaces thereof and the insulating substrate is connected to a heat-dissipating base member to dissipate heat generated from the power semiconductor chip to the outside. In the semiconductor device, the conductor pattern on the rear surface bonded to the heat-dissipating base member includes a plurality of bonding portions to the corresponding heat-dissipating base member. Each of the plurality of bonding portions has a polygonal shape with six or more sides.

According to the invention, there is provided a method of manufacturing a semiconductor device having a connection structure in which a power semiconductor chip is mounted on an insulating substrate and the insulating substrate is connected to a heat-dissipating base member to dissipate heat generated from the power semiconductor chip to the outside. The method includes: bonding conductor patterns to front and rear surfaces of the insulating substrate in which the conductor pattern on the rear surface of the insulating substrate has a bonding portion having a rectangular shape and a predetermined curvature radius in the vicinity of corners; providing and heating sheet-shaped solder having a same planar shape as the conductor pattern and a predetermined thickness between the heat-dissipating base member and the conductor pattern; and solidifying the sheet-shaped solder to form a solder fixing layer connecting the conductor pattern to the heat-dissipating base member. The predetermined curvature radius is in the range of 1 mm to 10 mm.

Effect of the Invention

According to the invention, stress applied to the corners of the fixing layer is set to an elastic limit or less. In this way, it is possible to suppress and prevent the occurrence of a crack in the fixing layer. Therefore, the radiation performance of the semiconductor device which is used under harsh temperature conditions is ensured and it is possible to increase the lifespan of the semiconductor device. The above and other objects, features, and advantages of the invention will become more apparent by the following description associated with the accompanying drawings illustrating preferred embodiments of the invention.

BRIEF DESCRIPTION OF DRAWINGS

FIGS. 4(A), 4(B) are diagrams illustrating a bonding state between a heat-dissipating base member and an insulating substrate of a semiconductor device according to a second embodiment of the invention.

FIGS. 5(A)-5(C) are diagrams illustrating a bonding state between a heat-dissipating base member and an insulating substrate of a semiconductor device according to a third embodiment of the invention.

FIGS. 7(A), 7(B) are diagrams illustrating a bonding state between a heat-dissipating base member and an insulating substrate of a semiconductor device according to a fifth embodiment of the invention.

FIGS. 8(A), 8(B) are a vertical cross-sectional view and a plan view illustrating a semiconductor device according to the related art.

FIGS. 10(A), 10(B) are diagrams illustrating a crock which occurs in the solder fixing layer in a temperature cycle test.

BEST MODE(S) FOR CARRYING OUT THE INVENTION

Figure 1A:
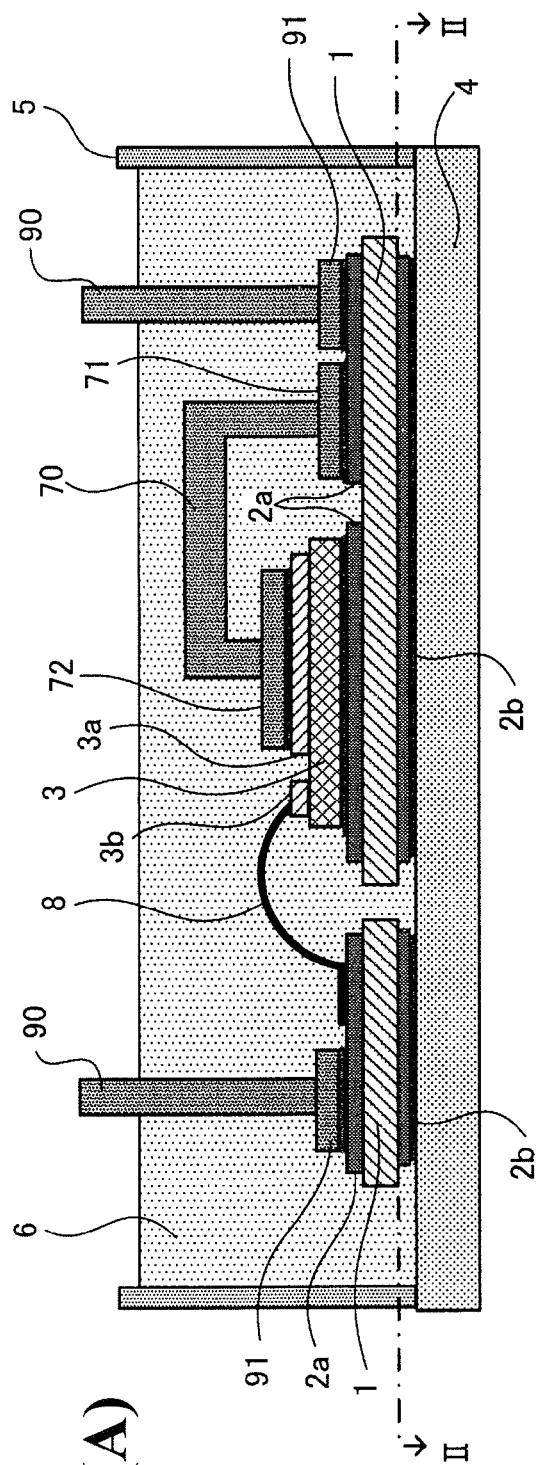
FIGS. 1(A), 1(B) are a vertical cross-sectional view and a plan view illustrating a semiconductor device according to a first embodiment of the invention.
Figure 1B:
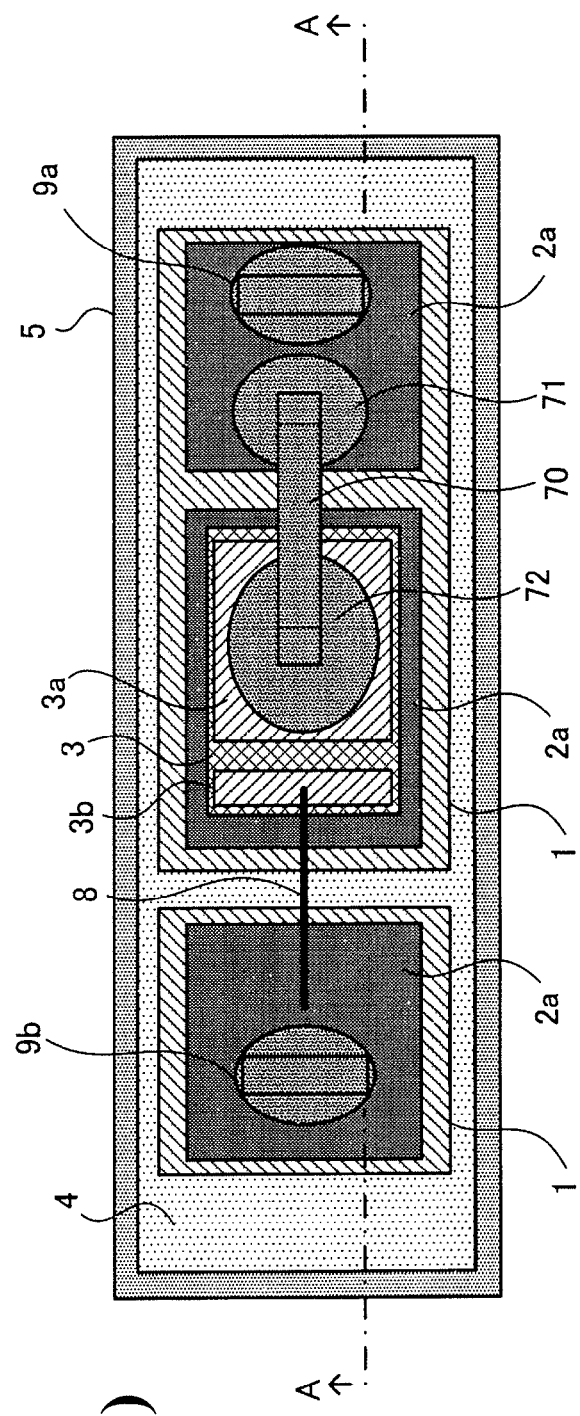
Figure 2:
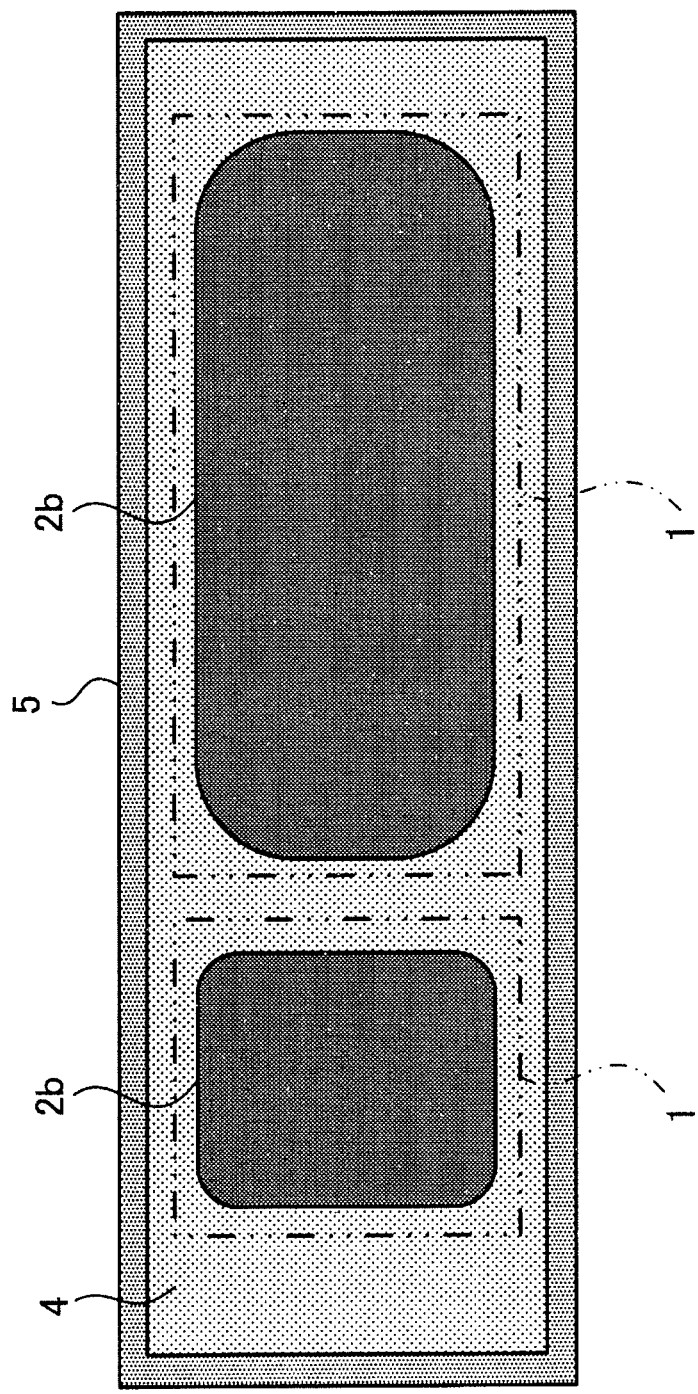
FIG. 2 is a cross-sectional view taken along the line II-II of FIG. 1(A).

Hereinafter, embodiments of the invention will be described with reference to the accompanying drawings. FIGS. 1(A), 1(B) are a vertical cross-sectional view and a plan view illustrating a semiconductor device according to a first embodiment of the invention. FIG. 2 is a cross-sectional view taken along the line II-II of FIG. 1(A).

In the power semiconductor device illustrated in the figure, a semiconductor chip 3 is mounted on an insulating substrate 1 having conductor patterns 2a and 2b bonded to the front and rear surfaces thereof, and the insulating substrate 1 is bonded to a heat-dissipating base member 4. In this way, it is possible to dissipate heat generated from the semiconductor chip 3 to the outside. In addition, in the power semiconductor device, external lead terminals 9a, 9b, which are lead frames of copper plates, are bonded to the conductor pattern 2a on the front surface of the insulating substrate 1 having the semiconductor chip 3 mounted thereon. The power semiconductor device includes an internal connection terminal 70 which connects a metal electrode 3a of the semiconductor chip 3 and the conductor pattern 2a. The connection structure is the same as that of the device according to the related art illustrated in FIG. 8.

The first characteristic of the power semiconductor device is that the outer shape of bonding portions 71, 72, and 91 of the internal connection terminal 70 and the external lead terminals 9a, 9b is a curved shape which is exemplified by a circular shape. The second characteristic thereof is that, as illustrated in FIG. 2, the corners of the conductor pattern 2b bonded to the heat-dissipating base member 4 are rounded and the outline of the conductor pattern has a curved shape, which makes it possible to reduce the concentration of stress and prevent the occurrence of a crack in a solder fixing layer between the heat-dissipating base member 4. That is, as illustrated in FIG. 2, a bonding portion of the conductor pattern 2b which is bonded to the heat-dissipating base member 4 on the rear surface side of the insulating substrate 1 has a rectangular shape and is slightly larger than the insulating substrate 1. In addition, the conductor pattern 2b has a predetermined curvature radius in the vicinity of the corners. The curvature radius may be experimentally in the range of 1 mm to 10 mm.

The bonding portions 71, 72 of the internal connection terminal 70 which has one end bonded to the conductor pattern 2a on the front surface of the insulating substrate on which the semiconductor chip 3 is mounted have a circular shape. In addition, the bonding portions 91 of the external lead terminal 9a, 9b which are drawn from the conductor pattern 2a on the front surface of the insulating substrate have a circular shape. In this way, the corners of the solder fixing layer are rounded and stress applied to the rounded corners can be set to an elastic limit or less. Therefore, the radiation performance of the semiconductor device is ensured.

Next, a crack which occurs when bonding members with different thermal expansion coefficients are bonded to each other by a solder layer will be described.

In a case in which metal members with different thermal expansion coefficients are connected to each other, when the environmental temperature thereof repeatedly increases and decreases, stress is repeatedly applied to the solder layer or a brazing filler metal layer for bonding the metal members since the metal members are expanded and contracted at different rates. As a result, a crack is likely to occur.

Figure 3:
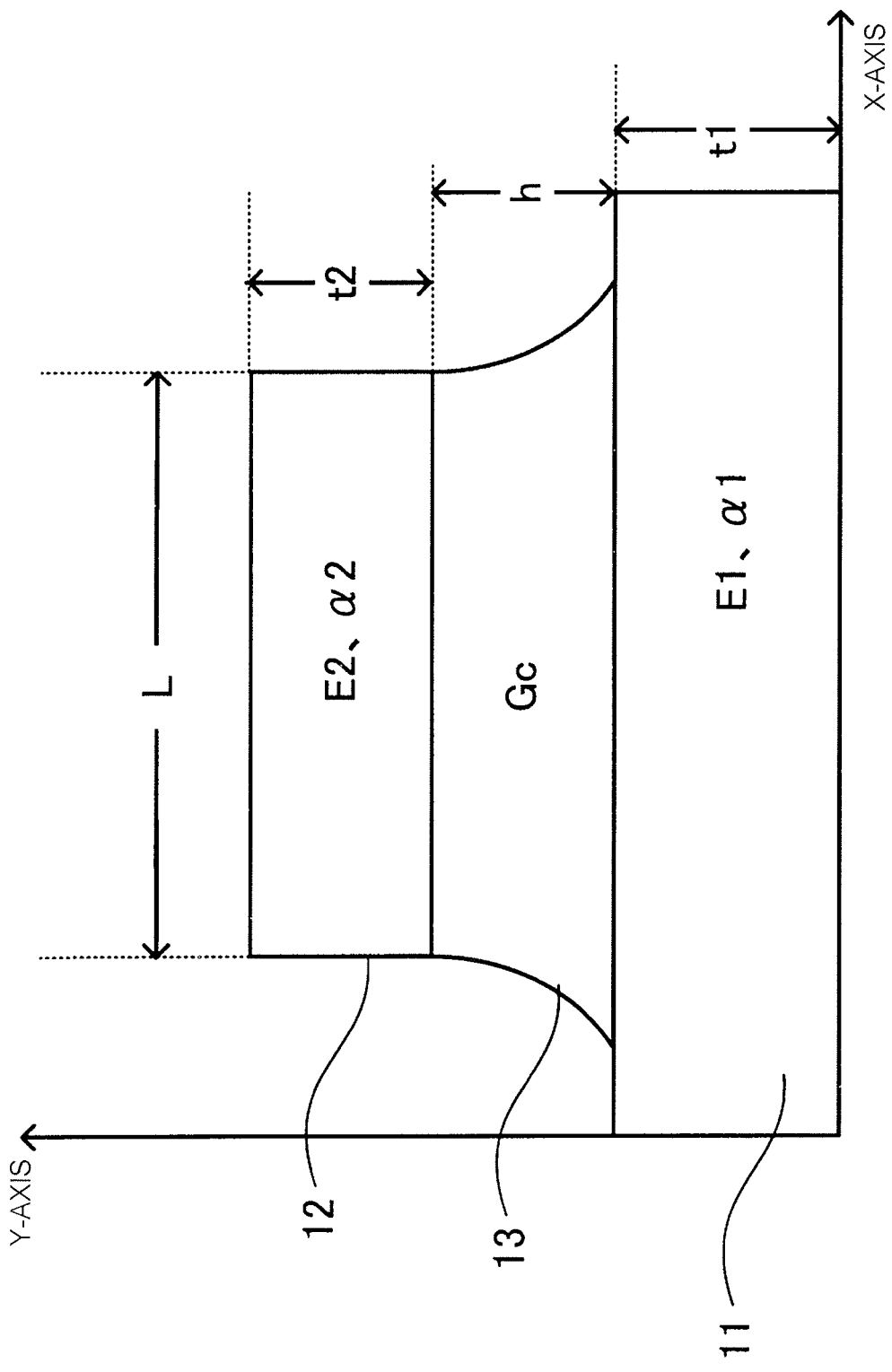
FIG. 3 is a cross-sectional view illustrating a state in which two metal members are bonded to each other by a solder fixing layer.

FIG. 3 is a cross-sectional view illustrating a state in which two metal members are bonded to each other by a solder fixing layer.

In FIG. 3, the X-axis represents the length direction of the members and the Y-axis represents the thickness direction of the members. It is assumed that metal members 11, 12 have different thermal expansion coefficients α1, α2 (α1<α2) and have longitudinal elastic moduli E1, E2, respectively. In addition, it is assumed that a fixing layer 13 is a solder layer with a shear elastic modulus Gc and has a thickness h.

As illustrated in FIG. 3, a solder fillet is formed in an outer circumferential portion of the fixing layer 13, with the second metal member 12 being bonded to the first metal member 11 through the solder fixing layer 13. In general, it has been known that the second metal member 12 with a length L and a thickness t2 is bonded to the first metal member 11 with a thickness t1 and the shear strain rate ($\Delta\gamma$) of the solder of the fixing layer 13 when a temperature variation of T[°C.] occurs in the bonded structure is calculated by the following Expression 1.

$$\Delta\gamma \approx (L/2)\cdot(\alpha 2-\alpha 1)\cdot T/\{(\sqrt{A})\cdot h\} \quad \text{[Expression 1]}$$

(where a coefficient A is $Gc/h \cdot \{1/(E2\cdot t2)+1/(E1\cdot t1)\}$).

According to Expression 1, as the thicknesses t1, t2 of the first and second metal members 11, 12 and the length L of the second metal member 12 increase, stress is applied to the fixing layer 13 at a larger shear strain rate $\Delta\gamma$. As a result, a crack is likely to occur.

That is, when the bonding portions 71, 72, and 91 of the internal connection terminal 70 and the external connection conductor 90 are bonded to the conductor pattern 2a on the front surface of the insulating substrate on which the semiconductor chip 3 is mounted, the length L in Expression 1 is reduced since the shape of the bonding portions is a circle. Similarly, the conductor pattern 2b which is bonded to the rear surface of the insulating substrate 1 has a rectangular bonding surface to the heat-dissipating base member 4 and the corner of the rectangular bonding surface has a predetermined curvature radius. Therefore, the length L in Expression 1 is reduced. In this way, it is possible to reduce the shear strain rate Δγ acting on the fixing layer 13.

In a method of manufacturing the power semiconductor device, first, bonding the conductor patterns 2a, 2b to the front and rear surfaces of the insulating substrate 1 is performed. In the bonding, the bonding portion of the conductor pattern to the rear surface of the insulating substrate 1 has a rectangular shape and the corners of the conductor pattern are rounded.

Then, sheet-shaped solder which has the same planar shape as the conductor pattern 2b and has a predetermined thickness is provided between the heat-dissipating base member 4 and the conductor pattern 2b and is heated. Then, the molten sheet-shaped solder is solidified to form a solder fixing layer which connects the conductor pattern 2b to the heat-dissipating base member 4. In addition, the conductor pattern 2b may be bonded to the heat-dissipating base member 4 by brazing.

Of the conductor patterns 2a, 2b, the conductor pattern 2b which is bonded to the heat-dissipating base member 4 is formed such that the thickness of a circumferential portion of the bonding surface to the insulating substrate 1 is less than that of the center of the bonding portion. In this way, it is possible to set stress applied to the solder fixing layer to an elastic limit or less. Therefore, the shear strain rate Δγ acting on the fixing layer 13 illustrated in FIG. 3 is further reduced.

FIGS. 4(a), 4(B) are diagrams illustrating a bonding state between a heat-dissipating base member and an insulating substrate of a semiconductor device according to a second embodiment of the invention.

Conductor patterns including four and ten divided conductor layers 2c are provided on the rear surfaces of insulating substrates 1a, 1b which are bonded to the heat-dissipating base member 4, respectively. Each of the conductor layers 2c has a rectangular pattern shape with rounded corners. In this way, it is possible to reduce the size of a solder fixing layer 13 for fixing each conductor layer 2c to the heat-dissipating base member 4.

That is, the length L of the second metal member 12 illustrated in FIG. 3 is reduced and the shear strain rate Δγ acting on the fixing layer 13 is reduced from the above-mentioned Expression 1. Therefore, the occurrence of a crack is prevented and it is possible to prevent the thermal fracture of the semiconductor device. The number of divided conductor layers 2c is not limited four or ten, but one insulating substrate may be divided into two or more conductor layers. In this case, the same effect as described above is obtained.

FIGS. 5(A)-5(C) are diagrams illustrating a bonding state between a heat-dissipating base member and an insulating substrate of a semiconductor device according to a third embodiment of the invention.

The power semiconductor device includes bonding portions 20 which protrude from a plurality of divided regions of a conductor pattern 2b on the rear surface of the insulating substrate bonded to a heat-dissipating base member 4 to the heat-dissipating base member 4. In this case, it is possible to reduce the size of a solder fixing layer 13 for fixing each of the bonding portions 20 to the heat-dissipating base member 4.

Figure 6A:
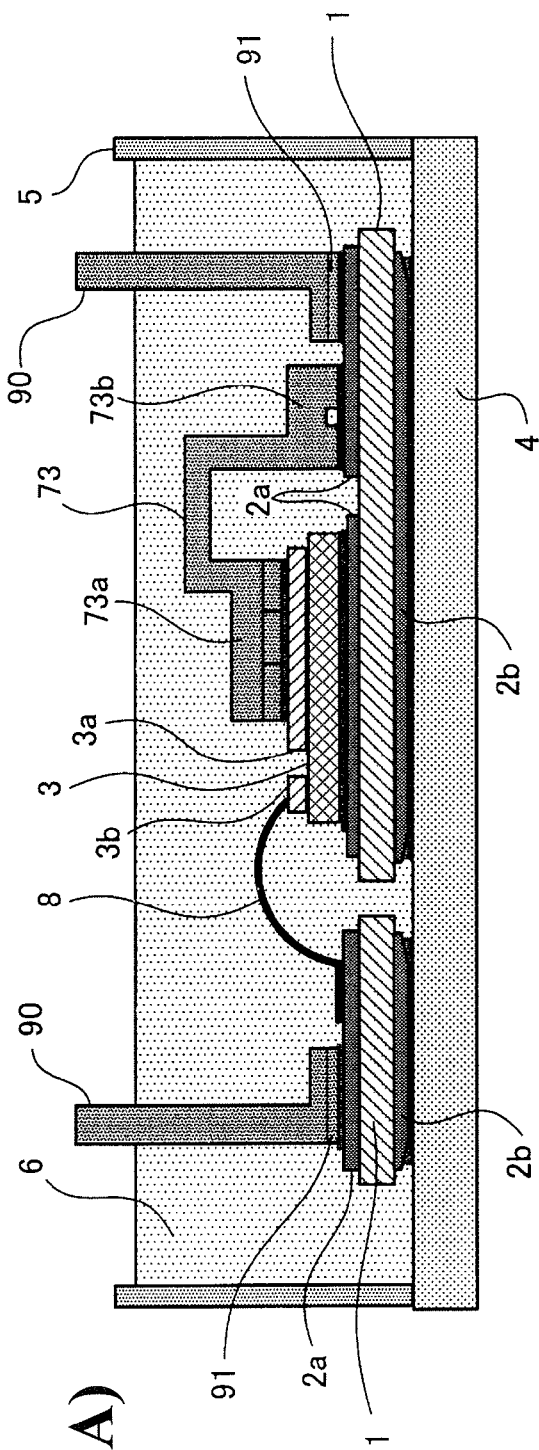
FIGS. 6(A), 6(B) are a plan view and a vertical cross-sectional view illustrating a semiconductor device according to a fourth embodiment of the invention.
Figure 6B:
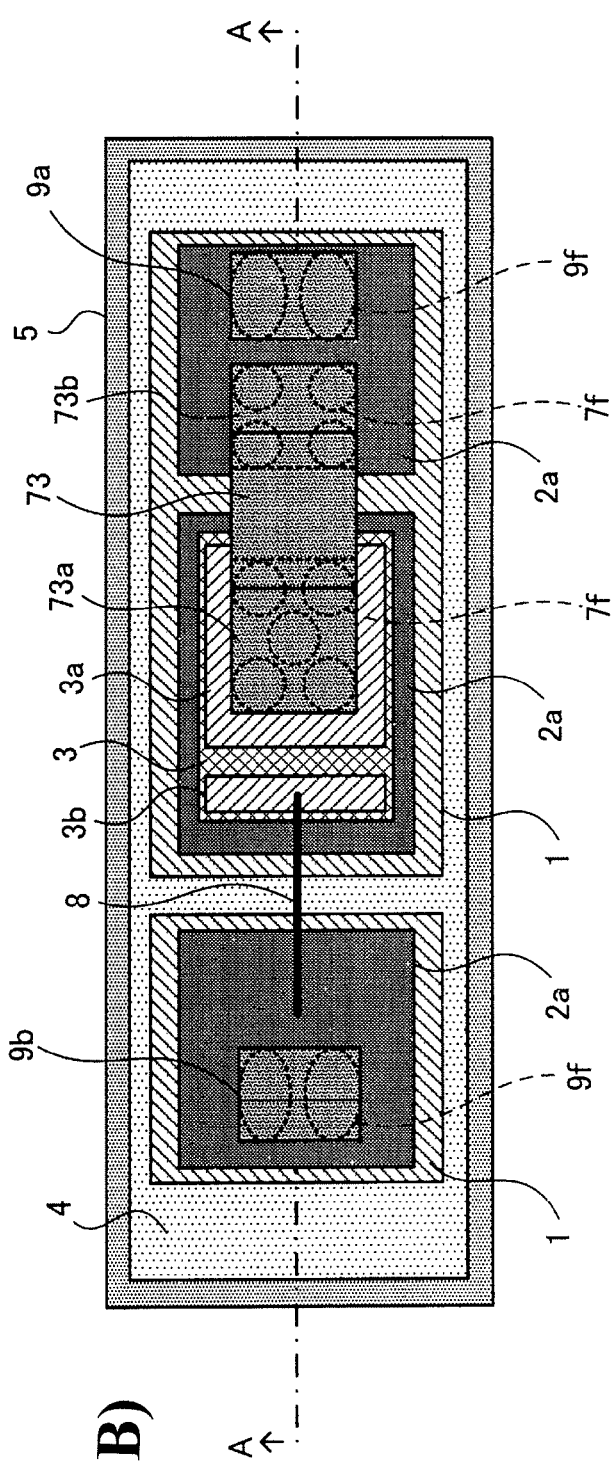
Figure 9:
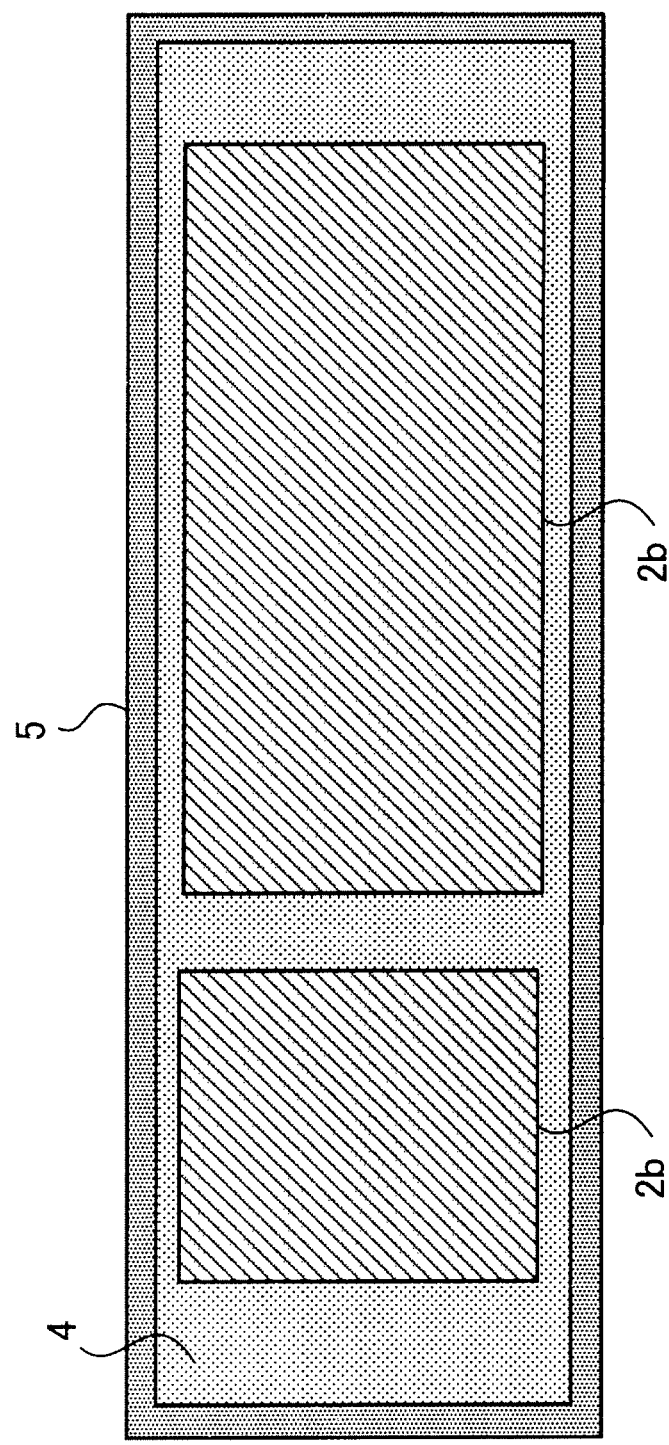
FIG. 9 is a cross-sectional view illustrating the semiconductor device according to the related art taken along the line IX-IX of FIG. 8(A).

FIGS. 6(A), 6(B) are a plan view and a vertical cross-sectional view illustrating a semiconductor device according to a fourth embodiment of the invention.

In this embodiment, a plurality of circular protruding portions 7f is formed on each of bonding portions 73a, 73b of an internal connection terminal 73. Similarly, two circular protruding portions 9f are formed on each of bonding portions 91 of external lead terminals 9a, 9b.

The circular protruding portions 7f, 9f are bonded to a metal electrode 3a and a conductor pattern 2a through an individual solder fixing layer 13. Therefore, the size of the solder fixing layer 13 is reduced and it is possible to reduce the shear strain rate Δγ acting on the fixing layer 13.

FIGS. 7(A), 7(B) are diagrams illustrating a bonding state between a heat-dissipating base member and an insulating substrate of a semiconductor device according to a fifth embodiment of the invention.

In this embodiment, as a modification of the first embodiment illustrated in FIG. 2 and a modification of the second embodiment illustrated in FIGS. 4(A), 4(B), conductor patterns 2b which bond insulating substrates 1a, 1b to a heat-dissipating base member 4 have two different shapes. Of the two conductor patterns 2b, the conductor pattern 2b illustrated in FIG. 7(A) includes a rectangular bonding portion having a curvature radius r in the vicinity of the corner and a plurality of curved (bent) portions (bend) b with a concave shape is formed in each side of the bonding portion. The curvature radius r may be experimentally in the range of 1 mm to 10 mm.

For the size of the curved portion b, when the curvature radius in the vicinity of the corner is r, it is preferable that the width Bw of the curved portion b be equal to or greater than r and the depth Bd of the curved portion b be equal to or greater than r. In this way, the conductor pattern 2b illustrated in FIG. 7(A) is configured such that the length L of a straight portion of the second metal member 12 illustrated in FIG. 3 is reduced. It is preferable that the corner of the inside bottom of the curved portion have the same curvature radius as described above. According to this structure, it is possible to reduce the shear strain rate Δγ of the corner.

On the other hand, the conductor pattern illustrated in FIG. 7(B) includes a plurality of divided conductor layers 2d and has a hexagonal pattern shape or a trapezoidal pattern shape which forms a portion of the hexagonal shape. In this case, when the dimension of the conductor pattern in the lateral direction in the plane is Sd, it is preferable that a gap Sg between the conductor layers 2d be equal to or greater than 0.1×Sd. In this way, when the individual conductor layer 2d is fixed to the heat-dissipating base member 4, it is possible to reduce the size of the solder fixing layer 13 and the shear strain rate Δγ acting on the fixing layer 13 is reduced. The shape of the plurality of divided conductor layers is not limited to a hexagon, but it may be a polygon having six or more sides. The polygon may be a regular polygon. When the shape of the divided conductor layer is a polygon having six or more sides, it is possible to reduce the shear strain rate Δγ at the corners. In addition, it is effective that an angular portion of the polygon has the above-mentioned curvature radius.

Only the principle of the invention has been described above. Various modifications and changes of the invention can be made by those skilled in the art. The invention is not limited to the above-mentioned structures and applications, but all of the corresponding modifications and equivalents fall within the scope of the invention defined by the appended claims and equivalents thereof.

EXPLANATIONS OF LETTERS OR NUMERALS

1 Insulating Substrate
2a and 2b Conductor Pattern

2c Conductor Layer
3 Semiconductor Chip
4 Heat-Dissipating Base Member
5 Resin Case
6 Sealing Member
7, 70, 73 Internal Connection Terminal
7f, 9f Circular Protruding Portion
8 Aluminum Wire
9a, 9b External Lead Terminal
11 First Metal Member
12 Second Metal Member
13, 13a, 13b Fixing Layer
20, 71, 72, 73a, 73b, 91 Bonding Portion
90 External Connection Conductor

What is claimed is:

1. A semiconductor device comprising:
a connection structure in which a power semiconductor chip is mounted on an insulating substrate having conductor patterns bonded to front and rear surfaces thereof, and the insulating substrate is connected to a heat-dissipating base member to dissipate heat generated from the power semiconductor chip to outside,
wherein the conductor pattern on the rear surface bonded to the heat-dissipating base member has a bonding portion having a rectangular shape and a predetermined curvature radius in vicinity of corners, and
the rear surface of the insulating substrate bonded to the heat-dissipating base member is formed with the conductor pattern including a plurality of divided conductor layers.

2. A semiconductor device comprising:
a connection structure in which a power semiconductor chip is mounted on an insulating substrate having conductor patterns bonded to front and rear surfaces thereof, and the insulating substrate is connected to a heat-dissipating base member to dissipate heat generated from the power semiconductor chip to outside,
wherein the conductor pattern on the rear surface bonded to the heat-dissipating base member has a bonding portion having a rectangular shape and a predetermined curvature radius in vicinity of corners, and
a metal terminal having one end bonded to the conductor pattern on the front surface mounted with the power semiconductor chip has a bonding portion having a circular shape.

3. The semiconductor device according to claim 1, wherein the conductor pattern on the rear surface bonded to the heat-dissipating base member includes bonding portions protruding toward the heat-dissipating base member on each of a plurality of divided regions of the conductor pattern.

4. The semiconductor device according to claim 1, wherein the conductor pattern on the rear surface bonded to the heat-dissipating base member is formed such that a thickness of the conduction pattern of a circumferential portion of a bonding surface to the insulating substrate is less than that of a center of the bonding portion.

5. The semiconductor device according to claim 2, wherein the metal terminal is an external lead terminal drawn from the insulating substrate with the power semiconductor chip mounted thereon, and
a bonding portion of the external lead terminal includes a plurality of protruding portions for the conductor pattern on the front surface.

6. The semiconductor device according to claim 2, wherein the metal terminal is an internal connection terminal connecting a front electrode of the power semiconductor chip to the conductor pattern, and
each bonding portion of the internal connection terminal includes a plurality of protruding portions.

7. A method of manufacturing a semiconductor device having a connection structure in which a power semiconductor chip is mounted on an insulating substrate and the insulating substrate is connected to a heat-dissipating base member to dissipate heat generated from the power semiconductor chip to outside, comprising:
bonding conductor patterns to front and rear surfaces of the insulating substrate in which the conductor pattern on the rear surface of the insulating substrate has a bonding portion having a rectangular shape and a predetermined curvature radius in vicinity of corners;
placing and heating a sheet-shaped solder having a same planar shape as the conductor pattern and a predetermined thickness between the heat-dissipating base member and the conductor pattern; and
solidifying the sheet-shaped solder to form a solder fixing layer connecting the conductor pattern to the heat-dissipating base member.

* * * * *

UNITED STATES PATENT AND TRADEMARK OFFICE
CERTIFICATE OF CORRECTION

| | |
|---|---|
| PATENT NO. | : 8,957,508 B2 |
| APPLICATION NO. | : 14/110841 |
| DATED | : February 17, 2015 |
| INVENTOR(S) | : Nagaune |

Page 1 of 1

It is certified that error appears in the above-identified patent and that said Letters Patent is hereby corrected as shown below:

In the Specification

Column 1, line 38 to 39, change "substrate made of," to --substrate 1 made of,--.

Signed and Sealed this
Thirtieth Day of June, 2015

Michelle K. Lee
*Director of the United States Patent and Trademark Office*